United States Patent [19]

Bernzweig

[11] Patent Number: 4,594,559
[45] Date of Patent: Jun. 10, 1986

[54] METAL DETECTOR AUDIO AMPLIFIER

[76] Inventor: David S. Bernzweig, 24 Raleigh Rd., Framingham, Mass. 01701

[21] Appl. No.: 531,295

[22] Filed: Sep. 12, 1983

[51] Int. Cl.⁴ .......................... H03F 1/26; G01V 3/11
[52] U.S. Cl. ...................................... 330/149; 324/329
[58] Field of Search .............. 324/326, 327, 328, 329; 307/559; 328/171; 330/278, 284, 149

[56] References Cited
U.S. PATENT DOCUMENTS 4,376,267  3/1963  Chu et al. ............................ 330/284
4,486,712  12/1984  Weber ................................. 324/329

Primary Examiner—James B. Mullins
Assistant Examiner—G. Wan
Attorney, Agent, or Firm—William Nitkin

[57] ABSTRACT

An accessory device for use with a metal detector with means to amplify the low, barely audible audio output of the metal detector so that it can be easily heard with further means to dampen louder audio output signals causing those signals to be softer.

2 Claims, 2 Drawing Figures

METAL DETECTOR AUDIO AMPLIFIER

BACKGROUND OF THE INVENTION

1. Field of the Invention

The device of this invention is in the area of metal detectors and more particularly relates to an accessory device for amplifying the low volume audible signals while dampening signals of above predetermined volume.

2. History of the Prior Art

Metal detectors used by individuals can emit an audible signal when their search coil passes over buried metal objects. When objects are near the surface, the metal detector produces a loud audible signal while objects that are more deeply buried will cause the detector to emit a softer, less audible signal. These less audible signals often represent more valuable objects such as older coins and artifacts. To hear these less audible signals better, the metal detector user will often use earphones connected to the metal detector which brings the audible signal close to the ear and blocks out other distracting sounds from the environment making it easier for the user to hear the softer signals. Unfortunately when detecting buried metal objects located close to the surface, the loud signal generated can then hurt the user's ears. Further, many times deeply buried objects cause the metal detector to produce an audible signal so soft that even with the aid of earphones, the signals are inaudible.

SUMMARY OF THE INVENTION

It is an object of this invention to provide an accessory amplifier for metal detectors which amplifies barely audible signals so that they can be easily heard and which also dampens loud signals so that they do not hurt the user's ears. The device is contained within a small casing which is attached to the metal detector. One method of attachment can be by the use of Velcro strips so that the amplifier is removable and reattachable. A coiled electric cable extends from the device and is plugged into the audio output jack of the detector. A second coil extends from the device to the earphones of the user. The device of this invention also acts effectively to increase the sensitivity of the metal detector because it increases the user's ability to tune the detector. Typical metal detectors have two wound coils in their search heads, each tuned to the other. A control knob allows the user to adjust the tuning by turning the audible sound created by the two coils down to just were it is no longer audible. If the sound is soft then it may be difficult to fine tune the detector as the tuning may not be perfect. With the signal amplified from the device of this invention, the coils can be perfectly balanced and the detector will operate with a higher sensitivity than if it were not perfectly tuned.

DESCRIPTION OF THE PREFERRED EMBODIMENT(S)

Figure 1:
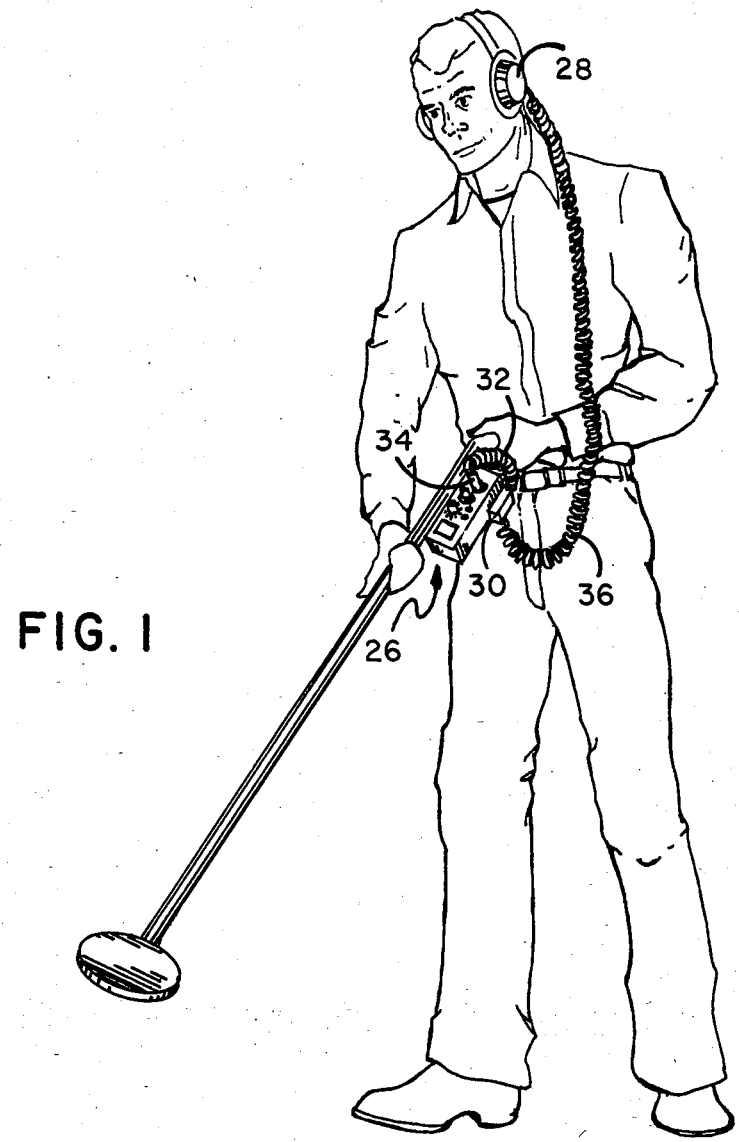
FIG. 1 illustrates a metal detector in use with the device of this invention attached thereto.

FIG. 1 illustrates an individual utilizing a metal detector 26 having the device 30 of this invention attached thereto. The device is interconnected to the metal detector by cable 32 with jack 34 inserted into the audio output of the detector. A second cable 36 extends from the device of this invention up to earphones 28. The device of this invention is small and lightweight, does not interfere at all with the use of the metal detector and, as mentioned above, can be attached to the detector by any removable and reattachable means such as by Velcro strips, snaps, slide clips or any equivalent method of fastening.

Figure 2:
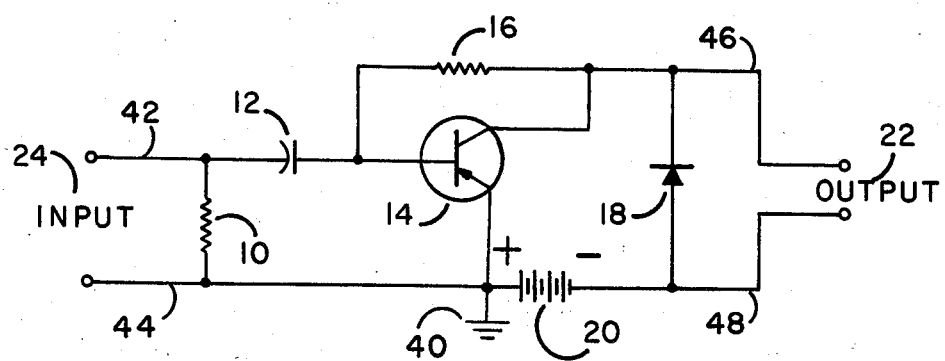
FIG. 2 is a schematic of the circuit of the device of this invention.

FIG. 2 illustrates the circuitry of the device with cable 32 not shown to be attached to input 24 carrying the signals of metal detector 26 to input 24. First input line 42 extends from the input 24 to the base of transistor 14. Between input 24 and transistor 14 on line 42 is capacitor 12 which can be a 1NF electrolytic capacitor or equivalent. Before electrolytic capacitor 12 on line 42 and before the emitter of transistor 14, the first and second input lines are interconnected by resistor 10 which can be a 1K resistor or equivalent. Transistor 14 can be a 2N3906 transistor or equivalent. The collector of transistor 14 is interconnected by a feedback loop through resistor 16 which can be a 3.3K resistor or equivalent to first input line 42 between capacitor 12 and the base of transistor 14. On second input line 44 after resistor 10 is battery 20 which can be a 1.5 volt AA penlight batter. The emitter of transistor 14 is interconnected on the second input line 44 between resistor 10 and battery 20 which interconnection point 40 is grounded. First output line 46 extends from the collector of transistor 14 and second output line 48 extends from the negative pole of battery 20 between which output lines are interconnected diode 18 which can be a 1N34A germanium point contact diode or equivalent. After diode 18, output 22 is interconnected by a jack direct connection or equivalent means to cable 36 to carry the signal to earphones 28. The transistor and its related circuitry amplify the input signal while diode 18 acts as a sound dampener cutting off the amplitude of louder signals making their sound softer at the output while not effecting the amplified lower volume signals. When the device is not in use there is no power drain on the battery as the circuit only becomes operative when the earphone is plugged into the output jack or if the earphones have a direct connection, then when the input cable 32 is plugged into the metal detector.

Although the present invention has been described with reference to particular embodiments, it will be apparent to those skilled in the art that variations and modifications can be substituted therefor without departing from the principles and spirit of the invention.

I claim:

1. An accessory device for use with a metal detector of the type using earphones, said device being connected to the audio output of said metal detector comprising:
    means to amplify low audio signals from said audio output to easily audible levels;
    means to dampen loud signals causing those signals to be softer, said device including:
    a casing;
    means to releasably attach said casing to said metal detector;
    a first cable means to attach to said audio output and carry said signal to said casing;
    an electronic circuit within said casing including:
        an input having a first input line and second input line extending therefrom, said input lines being interconnected by said first cable means to said audio output;
a transistor having a base, emitter and collector;
said first input line extending to the base of said transistor;
said second input line extending to the emitter of said transistor;
a capacitor on said first input line between said input and the base of said transistor;
a first resistor, one end of which is attached to said first input line between said capacitor and said input and the second end of which is attached to said second input line between said transistor's emitter and said input;
a feedback loop with a second resistor thereon extending from said transistor's collector and said first input line between said capacitor and the base of said transistor;
a power source such as a 1.5 volt battery on said second input line;
a ground between said power source and said first resistor on said second input line;
a line interconnecting said transistor's emitter to said ground;
a first output line extending from said transistor's collector;
a second output line extending from said power source;
said means for dampening loud signals including:
a diode having its first end connected to said first output line and its second end connected to said second output line; and
a second cable means attaching said first and second output lines to said earphones.

2. An accessory device for use with a metal detector of the type using earphones to improve the sensitivity tuning of said detector's coils, said device being connected to the audio output of said metal detector comprising:

means to amplify low audio tuning signals from said audio output to an easily audible level to balance the coils in the search head including:
a casing;
means to releasably attach said casing to said metal detector;
a first cable means to attach to said audio output and carry said signal to said casing;
an electronic circuit within said casing including:
an input having a first input line and second input line extending therefrom, said input lines being interconnected by said first cable means to said audio output;
a transistor having a base, emitter and collector;
said first input line extending to the base of said transistor;
said second input line extending to the emitter of said transistor;
a capacitor on said first input line between said input and the base of said transistor;
a first resistor, one end of which is attached to said first input line between said capacitor and said input and the second side of which is attached to said second input line between said transistor's emitter and said input;
a feedback loop wth a second resistor thereon extending from said transistor's collector and said first input line between said capacitor and the base of said transistor;
a power source such as a 1.5 volt battery on said second input line;
a ground between said power source and said first resistor on said second input line;
a line interconnecting said transistor's emitter to said ground;
a first output line extending from said transistor's collector;
a second output line extending from said power source; and
a second cable means attaching said first and second output lines to said earphones.

* * * * *